United States Patent [19]

Takemae et al.

[11] Patent Number: 4,649,406
[45] Date of Patent: Mar. 10, 1987

[54] SEMICONDUCTOR MEMORY DEVICE HAVING STACKED CAPACITOR-TYPE MEMORY CELLS

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 619,897

[22] Filed: Jun. 12, 1984

Related U.S. Application Data

[63] Continuation-in-part of Ser. No. 560,171, Dec. 12, 1983.

[30] Foreign Application Priority Data

Dec. 20, 1982 [JP] Japan ................................ 58-222079
Jun. 29, 1983 [JP] Japan ................................ 57-115888

[51] Int. Cl.$^4$ ........................................... H02L 29/78
[52] U.S. Cl. .................... 357/23.6; 357/23.11; 357/51; 357/54
[58] Field of Search .................... 357/23.6, 23.11, 51, 357/59 G, 59 J, 54, 54 N

[56] References Cited

U.S. PATENT DOCUMENTS

| 3,740,731 | 6/1973 | Ohwada et al. | 357/23.6 X |
| 3,811,076 | 5/1974 | Smith, Jr. | |
| 3,893,146 | 7/1975 | Heeren | 357/23.6 X |
| 4,151,607 | 4/1979 | Koyanagi et al. | 357/23.6 X |
| 4,246,593 | 1/1981 | Bartlett. | |
| 4,355,374 | 10/1982 | Sakai et al. | 357/23.6 X |
| 4,460,911 | 7/1984 | Salters | 357/23.6 OR |

FOREIGN PATENT DOCUMENTS

| 0032279 | 11/1981 | European Pat. Off. | |
| 2493045 | 10/1980 | France. | |
| 0021170 | 2/1980 | Japan | 357/23.6 |
| 0154762 | 12/1980 | Japan | 357/23.6 |

*Primary Examiner*—Martin H. Edlow
*Assistant Examiner*—Sara W. Crane
*Attorney, Agent, or Firm*—Staas & Halsey

[57] ABSTRACT

In a semiconductor memory device having stacked capacitor-type memory cells, the capacitor of each memory cell includes a base electrode, an insulating layer, and a counter electrode. The base electrode of each memory cell is partly superposed without contact on the base electrodes of other adjacent memory cells.

12 Claims, 15 Drawing Figures

SEMICONDUCTOR MEMORY DEVICE HAVING STACKED CAPACITOR-TYPE MEMORY CELLS

CROSS-REFERENCE TO RELATED APPLICATION

This application is a continuation-in-part of application Ser. No. 560,171 filed on Dec. 12, 1983, for "Semiconductor Memory Device Having Stacked Capacitor-Type Memory Cells."

BACKGROUND OF THE INVENTION

The present invention relates to a metal-oxide semiconductor (MOS, or more broadly, MIS) dynamic semiconductor memory device having stacked capacitor-type memory cells.

Recently, MOS memory cells of a one-transistor one-capacitor type have usually been used in MOS dynamic memory devices. A fine lithographic technology has been developed so as to reduce the size of the elements of each memory cell, thereby obtaining a large capacity of a highly integrated semiconductor device. However, there is a limit to obtaining a high integration and a large capacity by size reduction only. In addition, size reduction of memory cells increases the generation rate of soft errors and the number of harmful effects due to hot electrons and hot holes. For improving memory cells of a one-transistor one-capacitor type, stacked capacitor-type memory cells have been proposed (see: Technical Digest of the Institute of Electronics and Communication Engineers of Japan, SSD80-30, 1980, July). Each stacked capacitor-type memory cell comprises a transfer transistor, which is the same as that of the conventional memory cell, and a capacitor which comprises an electrode extending over a thick field-insulating layer and over its own transfer transistor, a counter electrode disposed on the electrode, and an insulating layer therebetween, thereby increasing the capacitance of the capacitor.

In the prior art, however, such stacked capacitor-type memory cells have been applied to devices having "open bit lines" which are arranged on both sides of a series of sense amplifiers, not to devices having "folded bit lines" which are arranged on one side of a series of sense amplifiers.

SUMMARY OF THE INVENTION

It is an object of the present invention to apply stacked capacitor-type memory cells to a semiconductor memory device having folded bit lines.

According to the present invention, in a semiconductor memory device having stacked capacitor-type memory cells, wherein the capacitor of each memory cell comprises a base electrode, an insulating layer, and a counter electrode, the base electrode of one memory cell is partly superposed without contact on the electrodes of other memory cells adjacent to the one memory cell, thereby remarkably increasing the capacitance of the capacitor.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
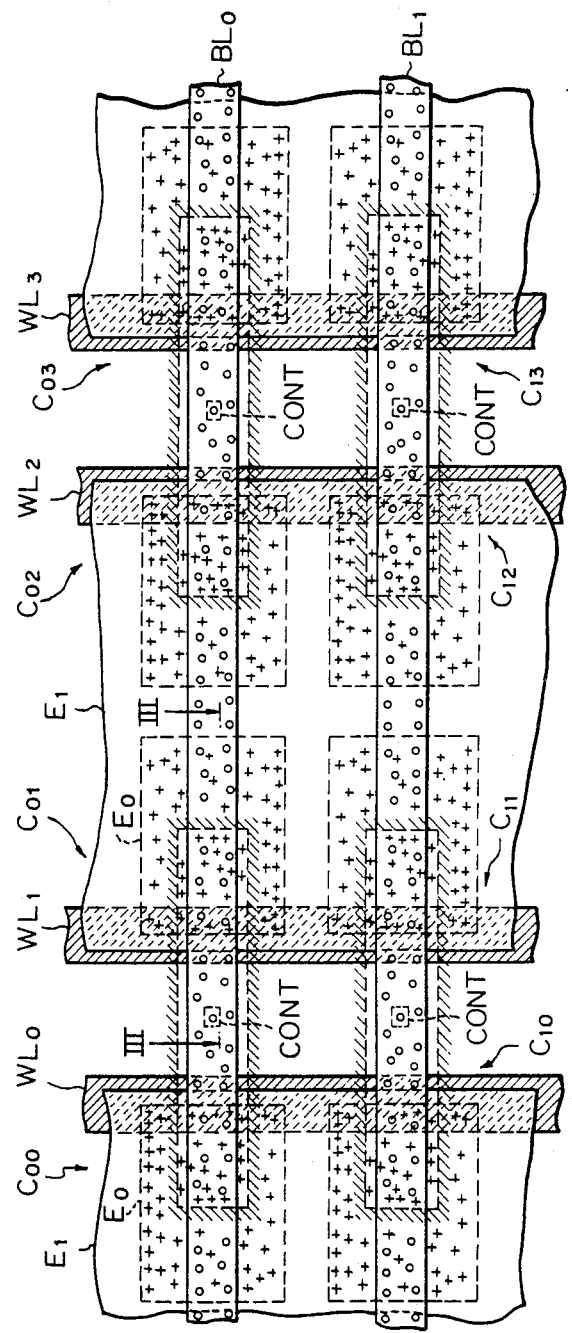
FIG. 1 is a plan view of a prior art semiconductor memory device incorporating stacked capacitor-type memory cells.
Figure 2:
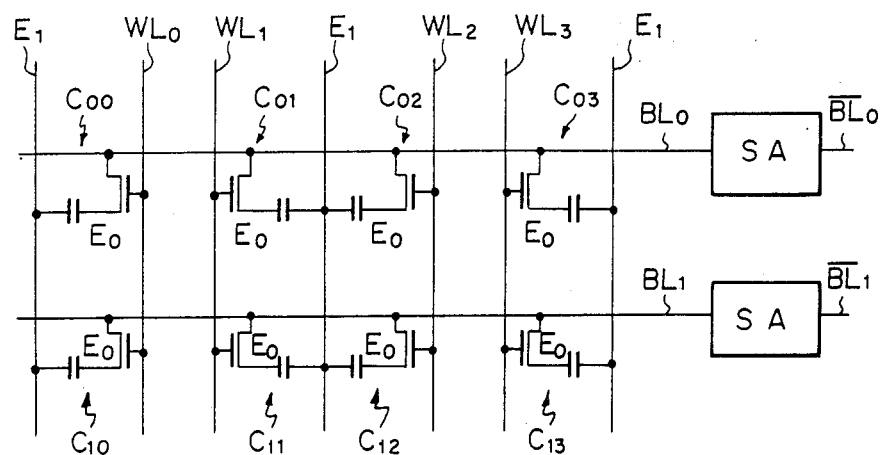
FIG. 2 is an equivalent circuit diagram of the device of FIG. 1.

In FIG. 1, which illustrates the prior art, and in FIG. 2, which is an equivalent circuit diagram of the device of FIG. 1, stacked capacitor-type memory cells are provided at intersections between the word lines $WL_0$, $WL_1$, $WL_2$, and $WL_4$ and bit lines $BL_0$ and $BL_1$. A capacitor of each memory cell is comprised of a base electrode $E_0$, a counter electrode $E_1$, and an insulating layer 6 (see FIG. 3) between the electrodes $E_0$ and $E_1$. Provided are the following conductive layers:

a first polycrystalline silicon layer for the word lines $WL_0$, $WL_1$, $WL_2$, and $WL_4$;

a second polycrystalline silicon layer for the base electrodes $E_0$;

a third polycrystalline silicon layer for the counter electrode $E_1$; and an aluminum layer for the bit lines $BL_0$ and $BL_1$.

Figure 3:
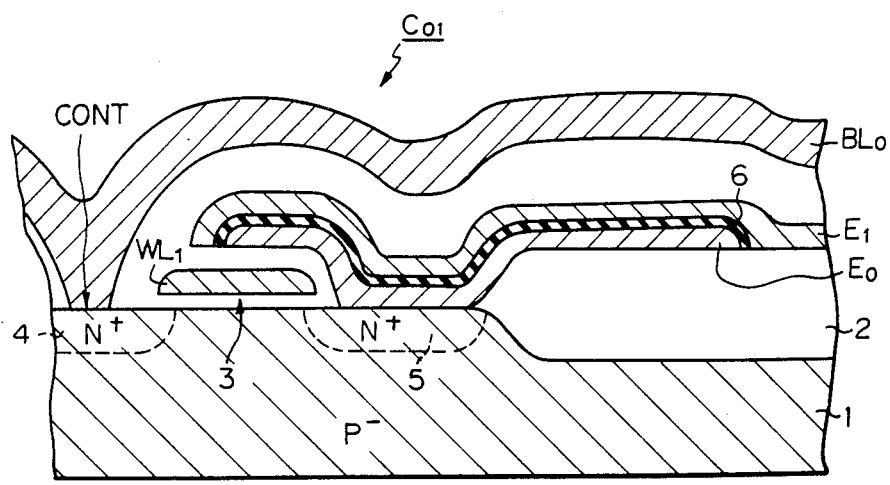
FIG. 3 is a cross-sectional view of the device of FIG. 1 taken along the line III—III in FIG. 1.

Note that "CONT" designates a contact hole for connecting the bit line $BL_0$ or $BL_1$ to an impurity diffusion (doped) region 4 on a semiconductor substrate 1 (see FIG. 3). In addition, the partly shaded areas designate field areas, and the inner areas thereof designate active areas.

One stacked capacitor-type memory cell, such as $C_{01}$, will be explained with reference to FIG. 3. In FIG. 3, a thick field oxide ($SiO_2$) layer 2 is formed on a $P^-$-type semiconductor substrate 1. Then a gate oxide ($SiO_2$) layer 3 is formed. Disposed on the layer 3 is a word line $WL_1$ serving as a gate of a transfer transistor which is made of the first polycrystalline silicon layer. After that, $N^+$-type impurity diffusion regions 4 and 5 serving as a source and a drain, respectively, of the transfer transistor are formed by self-alignment.

A base electrode $E_0$ made of the second polycrystalline silicon layer is formed on the word line $WL_1$ and the field oxide layer 2. In this case, the base electrode $E_0$ is connected electrically to the impurity diffusion region 5. An insulating layer 6 as a capacitor dielectric, which is made of, for example, chemical vapor deposition (CVD) silicon nitride ($Si_3N_4$), is formed on the base electrode $E_0$. Futher, the counter electrode $E_1$ made of the third polycrystalline silicon layer is formed on the insulating layer 6.

Note that the insulating layer 6 has a large dielectric constant and a small leak current characteristic. The blank portions of FIG. 3 designate other insulating layers made of $SiO_2$, phosphosilicate glass (PSG), or the like.

In FIG. 3, since a capacitor formed by the base electrode $E_0$, the insulating layer 6, and the counter electrode $E_1$ extends over the field oxide layer 2 and the word line $WL_1$, the capacitance thereof is larger than that of the conventional one-transistor one-capacitor type of memory cell in which a capacitor is formed on the impurity diffusion region 5. This characteristic is beneficial in obtaining a high integration and a large capacitance.

Figure 5:
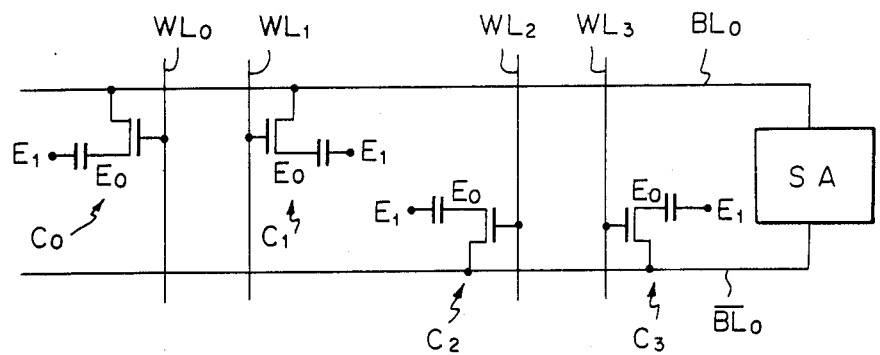
FIG. 5 is an equivalent circuit diagram of the device of FIG. 4.

However, the stacked capacitor-type memory cells as illustrated in FIGS. 1 and 3 are applied to a device having an open bit line layout as illustrated in the equivalent circuit diagram of FIG. 2, but are not applied to a device having a folded bit line layout as illustrated in the equivalent circuit diagram of FIG. 5.

Note that the folded bit line layout, as compared with the open bit line layout, is disadvantageous in regard to integration density, but is advantageous in regard to noise immunity since the noises generated in each of a pair of bit lines are compensates for each other at a sense amplifier which senses and amplifies the potential difference between the bit line pair.

Figure 4:
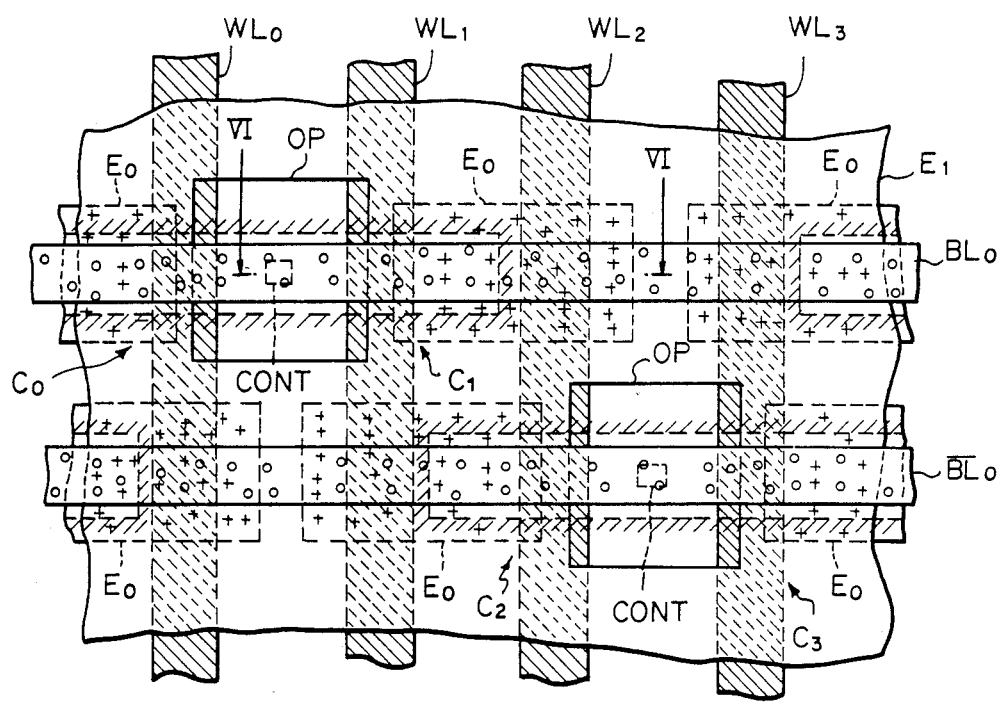
FIG. 4 is a plan view of an embodiment of the semiconductor memory device incorporating stacked capacitor-type memory cells according to the present invention.

In FIG. 4, which illustrates an embodiment of the present invention, and in FIG. 5, which is an equivalent circuit diagram of the device of FIG. 4, stacked capacitor-type memory cells $C_0$ and $C_1$ are provided at intersections between the word lines $WL_0$ and $WL_1$ and the bit line $\overline{BL_0}$, but no memory cells are provided at intersections between the word lines $WL_2$ and $WL_3$ and the bit line $BL_0$. On the other hand, stacked capacitor-type memory cells $C_2$ and $C_3$ are provided at intersections between the word lines $WL_2$ and $WL_3$ and the bit line $BL_0$, but no memory cells are provided at intersections between the word lines $WL_0$ and $WL_1$ and the bit line $\overline{BL_0}$. That is, two memory cells are provided at every two intersections along one bit line. This is because only one memory cell should be formed at one of two intersections between one word line and one bit line pair, resulting in a vacancy at half of all the intersections, which tends to decrease the integration density of the device.

However, according to the present invention, the base electrode $E_0$ of the capacitor of each memory cell is formed on its own word line (gate) and an adjacent word line to occupy the adjacent vacant intersection. In addition, the counter electrode $E_1$ of the capacitors of the memory cells is formed on the entire surface of the cell area of the device except for contact areas OP including the contact holes CONT.

Figure 6:
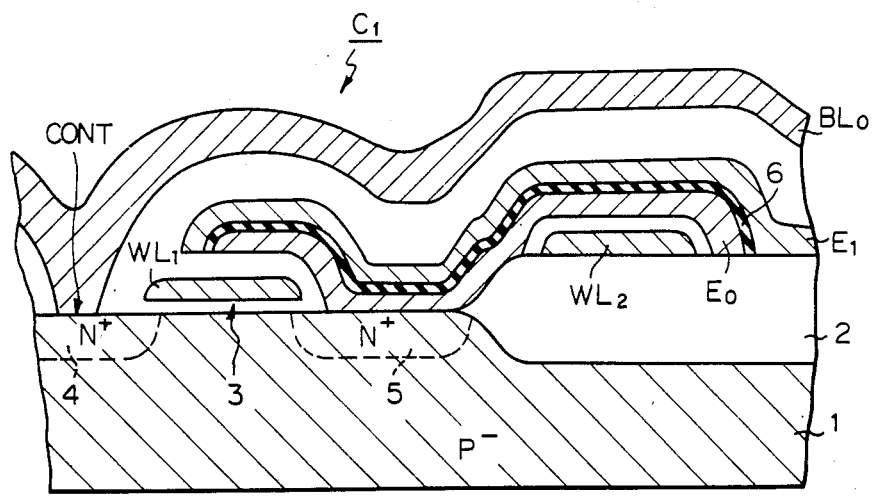
FIG. 6 is a cross-sectional view of the device of FIG. 4 taken along the line VI'VI in FIG. 4.

FIG. 6 is a cross-sectional view of the device of FIG. 4 taken along the line VI—VI in FIG. 4. In FIG. 6, the elements which are the same as those of FIG. 3 are denoted by the same reference numerals. As is illustrated in FIG. 6, the base electrode $E_0$ made of the second polycrystalline silicon layer is provided over its own word line $WL_1$ (the first polycrystalline silicon layer) and the adjacent word line $WL_2$ (the first polycrystalline silicon layer). Thus, the capacitance of a capacitor formed by the base electrode $E_0$, the counter electrode $E_1$, and the insulating layer 6 is increased, this being also beneficial in obtaining a high integration density and a large capacitance.

Figure 7:
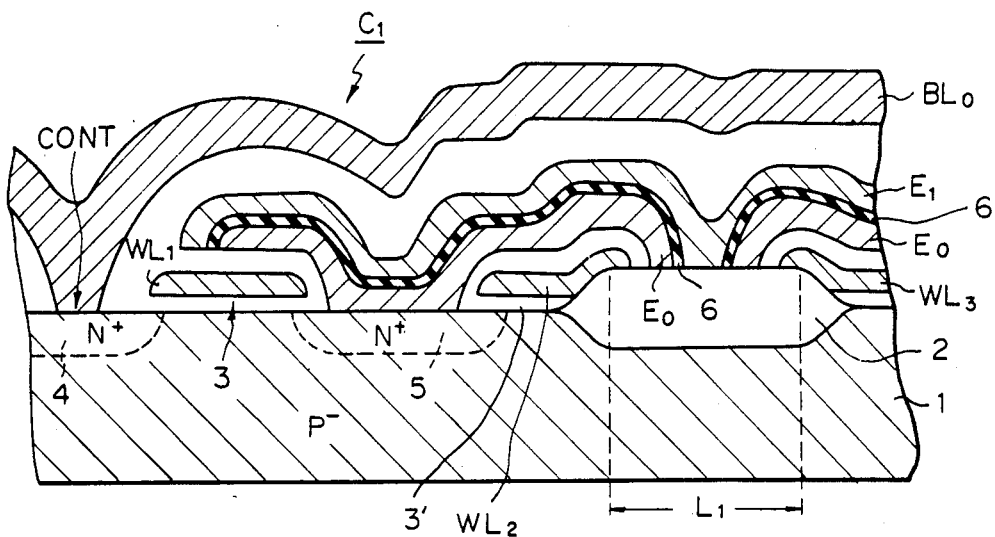
FIGS. 7 and 8 are modifications of the embodiment of FIG. 6.

FIG. 7 is a modification of FIG. 6. The difference between FIG. 7 and FIG. 6 is that in FIG. 7 the word line $WL_2$ is disposed partly on the thick field oxide layer 2 and partly on the thin oxide layer 3', which is the same as the gate oxide layer 3. As a result, the width $L_1$ of the field oxide layer 2 can be almost a minimum line width determined by the manufacturing technology. In FIG. 7, since no field oxide layer 2 is present between the word lines $WL_1$ and $WL_2$, the connection area between the second polycrystalline silicon layer $E_0$ and the impurity diffusion region 5 is determined by the space between the word lines $WL_1$ and $WL_2$ only. Therefore, this space can be a minimum. On the other hand, in FIG. 6, the above-mentioned connection area is determined by the word line $WL_1$ and the field oxide layer 2. Therefore, since this connection area is reduced due to the displacement of the alignment of the word line $WL_1$ and the field oxide layer 2, it is necessary to design the distance therebetween to be sufficient. In addition, it is necessary to design the distance between the impurity diffusion region 5 and the word line $WL_2$ with a sufficient value in view of the displacement of the alignment therebetween. Thus, the space between the word lines $WL_1$ and $WL_2$ in FIG. 7 can be reduced as compared with that in FIG. 6.

Figure 8:
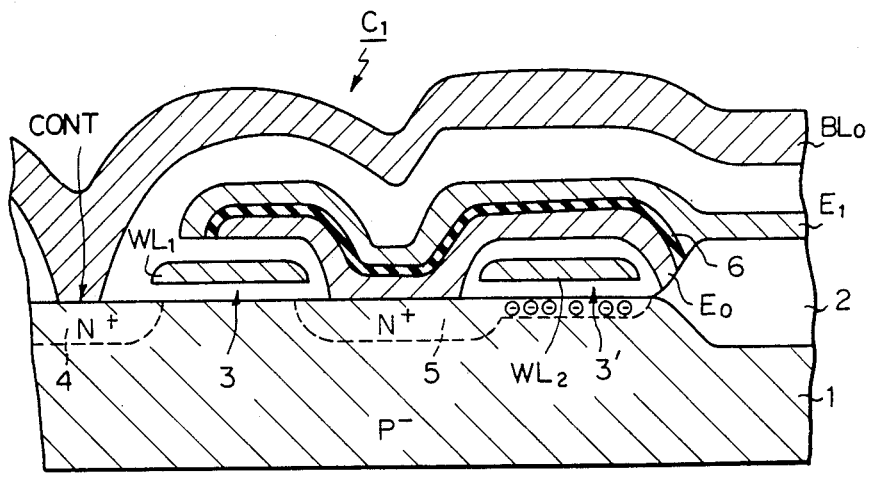

FIG. 8 is also a modification of FIG. 6. The difference between FIG. 8 and FIG. 6 is that in FIG. 8 the insulating layer 3' immediately beneath the adjacent word line $WL_2$ is made thin. In this case, the insulating layer 3' is also the same as the gate oxide layer 3 immediately beneath the word line $WL_1$. Further, N-type impurities are implanted in advance on the surface of the substrate 1 beneath the word line $WL_2$ by ion implantation or the like. Therefore, the MOS structure formed by the word line $WL_2$, the insulating layer 3', and the N-type impurity doped region of the substrate 1 serving as a charge-storing portion form a capacitor having a relatively large capacitance and which serves as a capacitor of the stacked capacitor-type memory cell and has normally-on characteristics. As a result, the capacitance of the capacitor of the memory cell of FIG. 7 is increased as compared with that of FIG. 6.

Returning to FIG. 4, the third polycrystalline silicon layer serving as the counter electrode $E_1$ is formed on the entire surface of the memory cell area of the device, except for the contact areas OP, including the contact holes CONT. Contrary to this, the area of the second polycrystalline silicon layer serving as the base electrode $E_0$ is remarkably small as compared with the third polycrystalline silicon layer serving as the counter electrode $E_1$, since a distance of at least 1 to 2 $\mu m$ is required between the base electrodes $E_0$ in view of current lithography techniques. As a result, since the capacitance of each memory cell is determined by the area of the second polycrystalline silicon layer, this capacitance is still relatively small.

Figure 9:
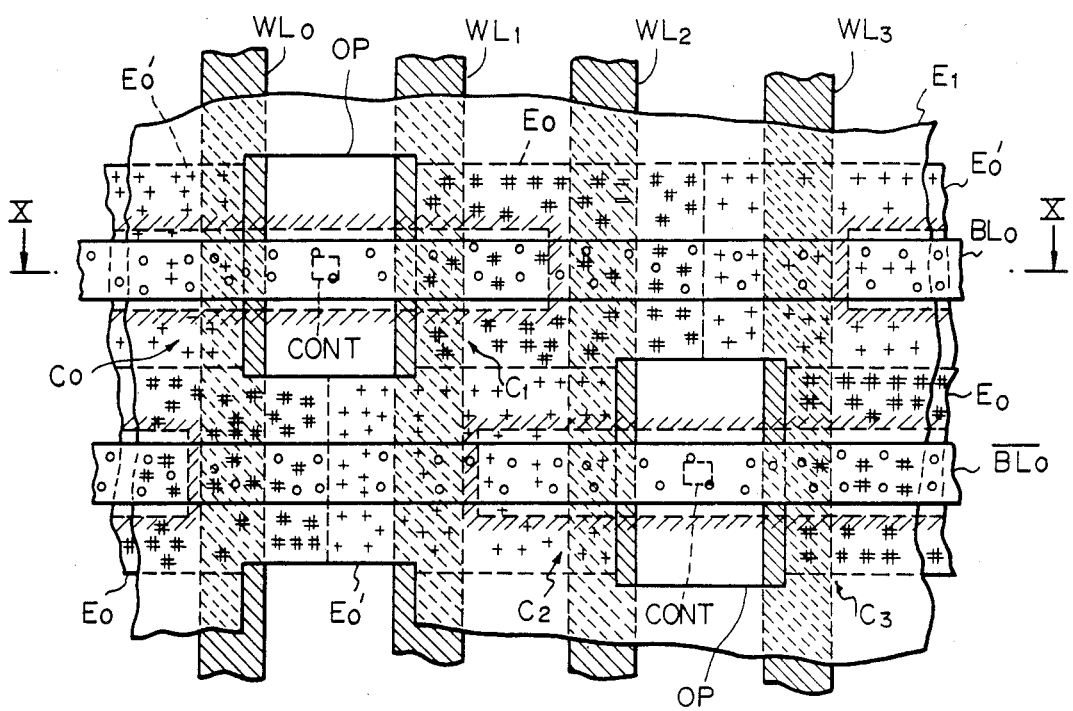
FIG. 9 is a plan view of another embodiment of the semiconductor memory device incorporating stacked capacitor-type memory cells according to the present invention.
Figure 10:
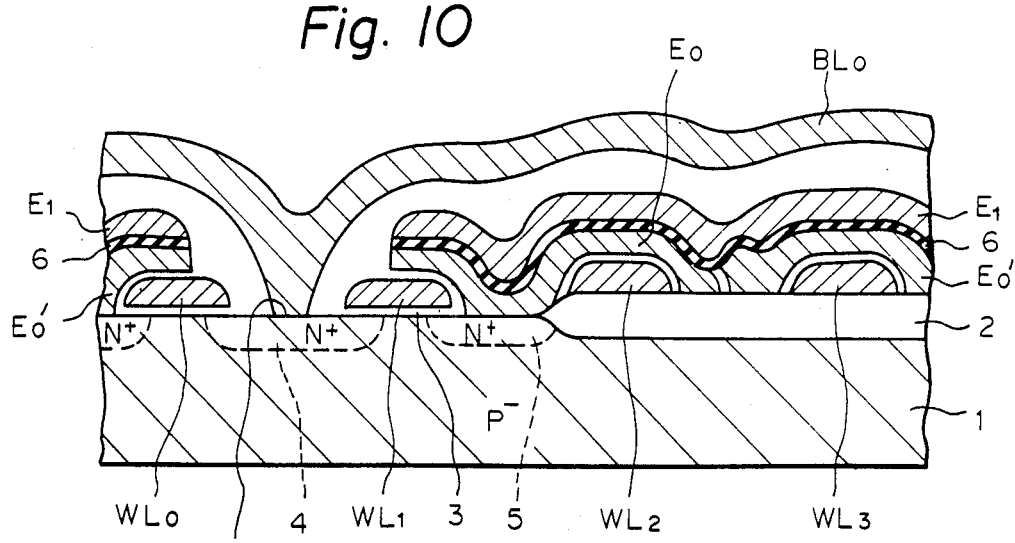
FIG. 10 is a cross-sectional view taken along line X—X of FIG. 9.

In FIG. 9, which illustrates another embodiment of the present invention, and in FIG. 10, which is a cross-sectional view taken along line X—X of FIG. 9, the second polycrystalline silicon layer of the base electrodes of the embodiment of FIG. 4 is split into double layers superposed partly on each other. In this case, four polycrystalline silicon layers are provided:

a first polycrystalline silicon layer for the word lines $WL_0$, $WL_1$, $WL_2$, and $WL_3$;

a second polycrystalline silicon layer for the first base electrode $E_0$;

a third polycrystalline silicon layer for the second base electrode $E_0'$; and a fourth polycrystalline silicon layer for the counter electrode $E_1$.

Note that, if the first base electrode $E_0$ belongs to one memory cell, the second base electrode $E_0'$ belongs to another memory cell adjacent to that one memory cell. As shown in FIG. 10, the first base electrode $E_0$ is partly and insulatively superposed on the second base electrode $E_0'$. Thus, the total area of the electrodes $E_0$ and $E_0'$ can be almost the same as the counter electrode $E_1$, thereby remarkably increasing the capacitance of the capacitor.

The manufacturing steps of the device of FIG. 10 will be explained with reference to FIGS. 11(1) through 11(5).

Figure 11:
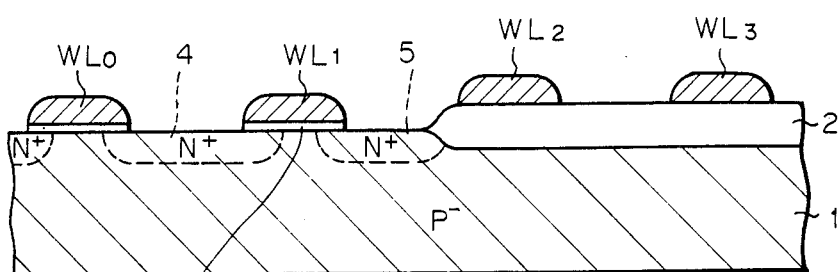
FIGS. 11(1) through 11(5) are cross-sectional views for explaining the manufacturing steps of the device of FIG. 10.
Figure 11:
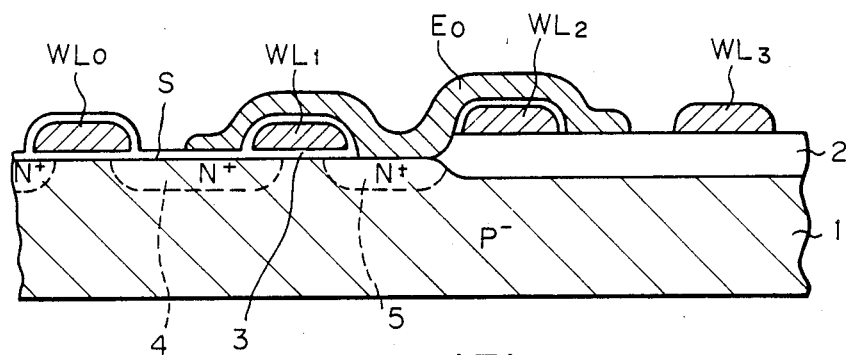
Figure 11:
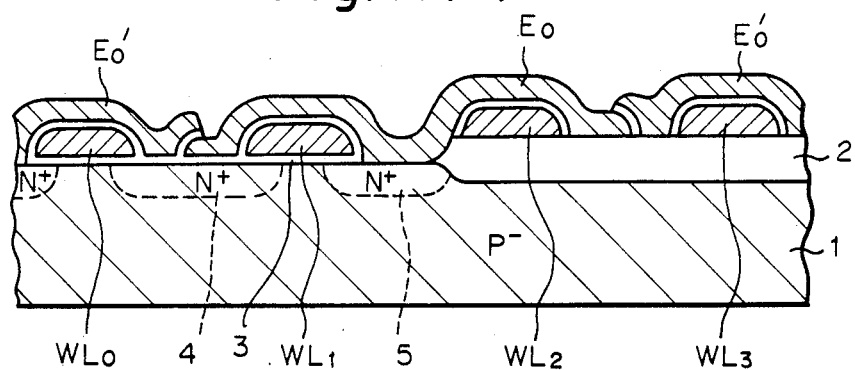
Figure 11:
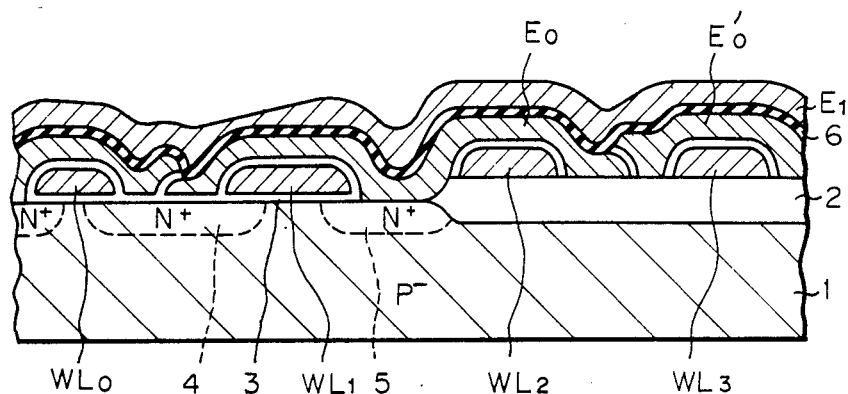
Figure 11:
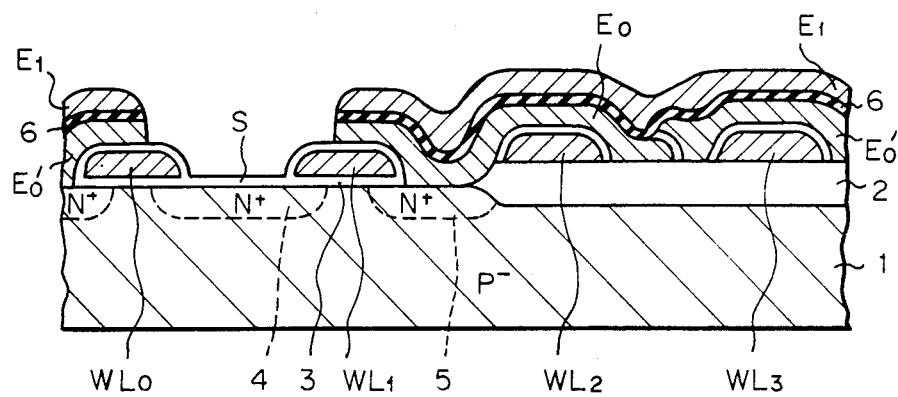

Referring to FIG. 11(1), a $P^-$-type monocrystalline silicon substrate 1 is oxidized with a silicon nitride mask so as to form the field oxide layer ($SiO_2$) 2. Oxidization is further carried out to grow a thin insulating layer ($SiO_2$) 3 on the substrate 1, a first polycrystalline silicon layer is formed by CVD thereon, and patterning is carried out to form the word lines $WL_0$, $WL_1$, $WL_2$, and $WL_3$. In addition, N-type ions such as $As^+$ or $P^+$ are doped with the mask of the first polycrystalline silicon layer onto the substrate 1, thereby forming the $N^+$-type impurity diffusion regions 4 and 5 within the substrate 1.

Next, referring to FIG. 11(2), after the first polycrystalline silicon layer is oxidized or after an oxidization layer is formed by CVD, the impurity diffusion regions 4 and 5 are exposed by etching. A second polycrystalline silicon layer is formed thereon and is patterned for the first base electrode $E_0$. Note that the thin insulating layer indicated by S on the impurity diffusion region 4 remains for later processes, explained later.

Next, referring to FIG. 11(3), after the second polycrystalline silicon layer for the first base electrode $E_0$ is oxidized or after an oxidization layer is formed by CVD, the impurity diffusion region 5 belonging to the adjacent cells (not shown) is exposed by etching. Then, a third polycrystalline silicon layer is formed by CVD and patterning is carried out for the second base electrode $E_0'$.

Next, referring to FIG. 11(4), an insulating layer is formed on the entire surface of the device by oxidization or CVD, and a fourth polycrystalline silicon layer for the counter electrode $E_1$ is formed thereon.

Next, referring to FIG. 11(5), in order to form the contact hole CONT of FIG. 10, the fourth polycrystalline silicon layer for the counter electrode $E_1$, the insulating layer 6, and the third and second polycrystalline silicon layers for the base electrodes $E_0$ and $E_0'$ are etched using self-alignment. That is, a resist pattern is first formed as a mask for etching the fourth polycrystalline silicon layer for the counter electrode $E_1$. After that, etching is performed thereon, thereby obtaining a pattern of the counter electrode $E_1$. Then, the resist pattern is removed. In addition, the insulating layer is etched with the patterned counter electrode $E_1$, and the third polycrystalline silicon layer for the base electrode $E_0'$ is etched with the mask of the patterned counter electrode $E_1$. Further, after the insulating layer beneath the etched third polycrystalline silicon layer is etched, the second polycrystalline silicon layer for the base electrode $E_0$ is etched with the mask of the patterned counter electrode $E_1$. In this case, the insulating layer, i.e., the thin oxide S directly above the impurity diffusion region 4, serves as a stopper for etching the third and second polycrystalline silicon layers.

Finally, an insulating layer such as phosphosilicate glass (PSG) is deposited on the entire surface of the device, and the contact hole CONT is formed thereon by etching. Then, an aluminum layer is deposited thereon by vacuum deposition or sputtering, and patterning is carried out so as to obtain the bit line $BL_0$ of FIG. 10.

Of course, the modifications as illustrated in FIGS. 7 and 8 can also be applied to the embodiment of FIGS. 9 and 10.

Note that the first, second, third, and fourth conductive layers can be made of a metal, instead of polycrystalline silicon. The bit lines can also be made of a metal other than aluminum. In addition, a $P^-$-type semiconductor substrate is used in the above-mentioned embodiments. However, obviously, an $N^-$-type substrate can be used.

As was explained hereinbefore, according to the present invention, the base electrode of one memory cell is superposed partly on the base electrodes of the other memory cells adjacent to the one memory cell so as to increase the capacitor capacitance, thereby obtaining a semiconductor memory device of a high integration density and a large capacitance and having a folded bit line layout.

We claim:

1. A semiconductor memory device comprising:
   a semiconductor substrate of a first conductivity type;
   a plurality of word lines made of a first conductive layer extending on said substrate and insulated therefrom;
   a plurality of bit lines made of a second conductive layer, said bit lines intersecting said word lines and being insulated therefrom; and
   stacked capacitor-type memory cells formed in the vicinity of respective intersections between said word lines and bit lines, to define an array of memory cells, wherein each of said memory cells comprises
   first and second impurity doped regions of a second conductivity type opposite to said first conductivity type formed in said substrate, each said first impurity doped region being electrically connected to a respective one of said bit lines, said first and second impurity doped regions and a respective portion of a respective one of said word lines forming a transfer transistor,
   a third conductive layer electrically connected to said second impurity doped region, for forming one of two capacitor electrodes wherein, for a memory cell at the interior of said array, said third conductive layer has a portion which overlaps, without contact, with a respective portion of the respective third conductive layer of an adjacent memory cell, so that the respective overlapping parts of the third conductive layers of the adjoining memory cells are at different levels,
   an insulating layer disposed on said third conductive layer to provide the dielectric of said capacitor,
   a fourth conductive layer, disposed on said insulating layer, for forming the other of said two capacitor electrodes, and
   said respective bit lines extending over and being insulated from said fourth conductive layer.

2. A device as set forth in claim 1, wherein another one of said word lines is located adjacent to the respective word line of said transfer transistor of each said memory cell, and said third conductive layer of each said memory cell extends over a respective part of said adjacent word line.

3. A device as set forth in claim 2, further comprising a thick field insulating layer formed on said substrate to extend between at least a respective portion of said part of said adjacent word line of each said memory cell and said substrate.

4. A device as set forth in claim 2 or 3, each said memory cell further comprising a thin insulating layer formed on said substrate between at least a corresponding portion of said part of said adjacent word line and said substrate.

5. A device as set forth in claim 4, further comprising a third impurity doped region of said second conductivity type within said substrate beneath said corresponding portion of said part of said adjacent word line, corresponding to said thin insulating layer, so that a MIS structure formed by said portion of said part of said adjacent word line, said thin insulating layer, and said third impurity doped region of said substrate has normally-on characteristics.

6. A device as set forth in claim 1, wherein said insulating layer providing said dielectric of said capacitor is made of silicon nitride.

7. The device of claim 2, further comprising a third impurity doped region of said second conductivity type within said substrate beneath said part of said adjacent word line and said thin insulating layer, so that a MIS structure formed by said part of said adjacent word line, said second insulating layer and said third impurity doped region of said substrate contribute to the capacitance of said stacked capacitor-type memory cells.

8. The device of claim 1, 2, 3 or 6, comprising a plurality of sense amplifiers connected respectively to said bit lines, wherein said device is of the folded-bit-line type.

9. The device of claim 7, comprising a plurality of sense amplifiers connected respectively to said bit lines, wherein said device is of the folded-bit-line type.

10. The device of claim 3, wherein said thick field insulating layer separates said adjacent memory cells having said overlapping portions of said third conductive layers, and said overlapping portions of said third conductive layers are formed over said thick field insulating layer.

11. The device of claim 10, wherein said fourth conducting layer extends in common for all of said memory cells.

12. The device of claim 11, wherein said first impurity region of adjoining pairs of said memory cells are provided in common, the two memory cells of each said adjoining pair not including the adjoining memory cell with which the overlap of the third conductive layer occurs.

* * * * *

UNITED STATES PATENT AND TRADEMARK OFFICE
CERTIFICATE OF CORRECTION

PATENT NO. : 4,649,406
DATED : March 10, 1987
INVENTOR(S) : Yoshihiro Takemae, Tomio Nakano, Kimiaki Sato It is certified that error appears in the above-identified patent and that said Letters Patent is hereby corrected as shown below:

Front Page [30] line 2, "58-222079" should be --57-222079--;
line 3, "57-115888" should be --58-115888--.

Column 2, line 12, "IV'VI" should be --VI-VI--.

Signed and Sealed this

Twenty-fifth Day of August, 1987

Attest:

DONALD J. QUIGG

Attesting Officer   Commissioner of Patents and Trademarks